United States Patent [19]

Toth et al.

[11] Patent Number: 4,568,413

[45] Date of Patent: Feb. 4, 1986

[54] METALLIZED AND PLATED LAMINATES

[75] Inventors: James J. Toth, 3807 E. Sprague Rd., Seven Hills, Ohio 44131; William J. Toth, Parma, Ohio

[73] Assignee: James J. Toth, Johnson City, Tenn.

[21] Appl. No.: 582,274

[22] Filed: Feb. 22, 1984

Related U.S. Application Data

[63] Continuation-in-part of Ser. No. 516,551, Jul. 25, 1983, abandoned.

[51] Int. Cl.$^4$ .................. C25D 5/00; B32B 31/00; B05D 5/12
[52] U.S. Cl. .................. 156/151; 156/233; 156/249; 156/630; 156/902; 204/38.4; 427/99; 428/458; 428/601
[58] Field of Search .............. 156/150, 151, 233, 235, 156/238, 247, 249, 630, 656, 659.1, 902; 204/15, 38 B; 427/99, 295, 296; 428/458, 674, 675, 601

[56] References Cited

U.S. PATENT DOCUMENTS

| | | |
|---|---|---|
| 3,886,022 | 5/1975 | Konicek . |
| 3,936,548 | 2/1976 | Konicek . |
| 4,084,032 | 4/1978 | Pasersky . |
| 4,162,932 | 7/1979 | Konicek . |
| 4,357,395 | 11/1982 | Lifshin et al. ............ 156/233 X |
| 4,394,419 | 7/1983 | Konicek . |
| 4,923,998 | 5/1977 | Cederberg . |

Primary Examiner—William A. Powell
Attorney, Agent, or Firm—Fay, Sharpe, Fagan, Minnich & McKee

[57] ABSTRACT

A carrier (10) is vapor-vacuum deposited with a vapor-vacuum deposited first metallic layer (14) of 10–90 nm in thickness. The carrier and vapor-vacuum deposited metal layers are selected of materials which, after vapor-vacuum depositing, adhere with less than about 3 pounds per linear inch of width, e.g., aluminum and copper or copper and copper. A second metallic layer (16) is electrolytically deposited to the vapor-vacuum deposited layer to increase the thickness of the first and second metal layers, taken together, to about 1–12 microns. The carrier and first and second metal layers are bonded under heat and pressure to a dielectric substrate (18). Thereafter, the carrier is peeled away leaving the vapor-vacuum deposited and electrolytically plated layers adhered to the dielectric substrate. Although the vapor-vacuum deposited layer and the electrolytically deposited layers may both be the same metal, such as copper which is preferred for circuit boards, the vapor-vacuum deposited layer may also be a relatively inactive metal, such as aluminum, chrome, zinc, or nickel, to protect the underlying electrolytically deposited metal layer from corrosion and staining.

14 Claims, 3 Drawing Figures

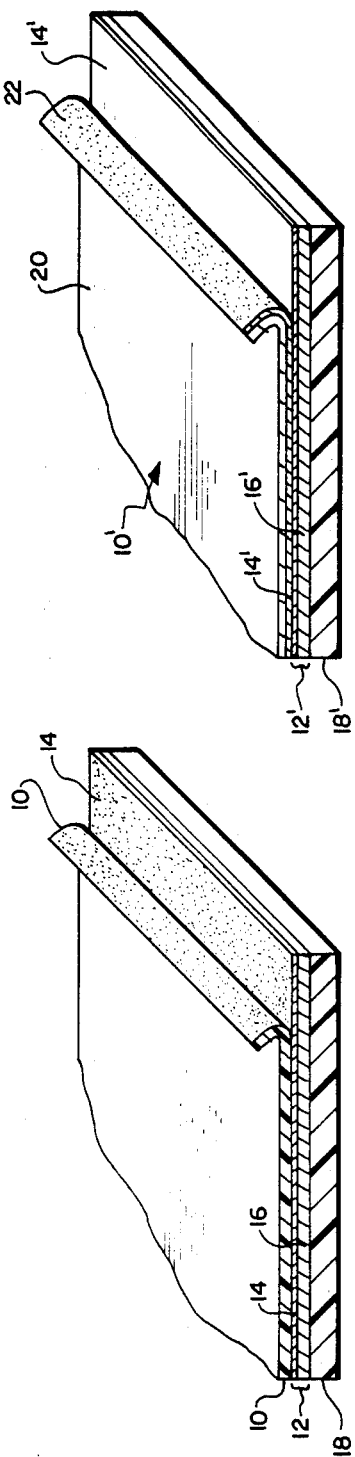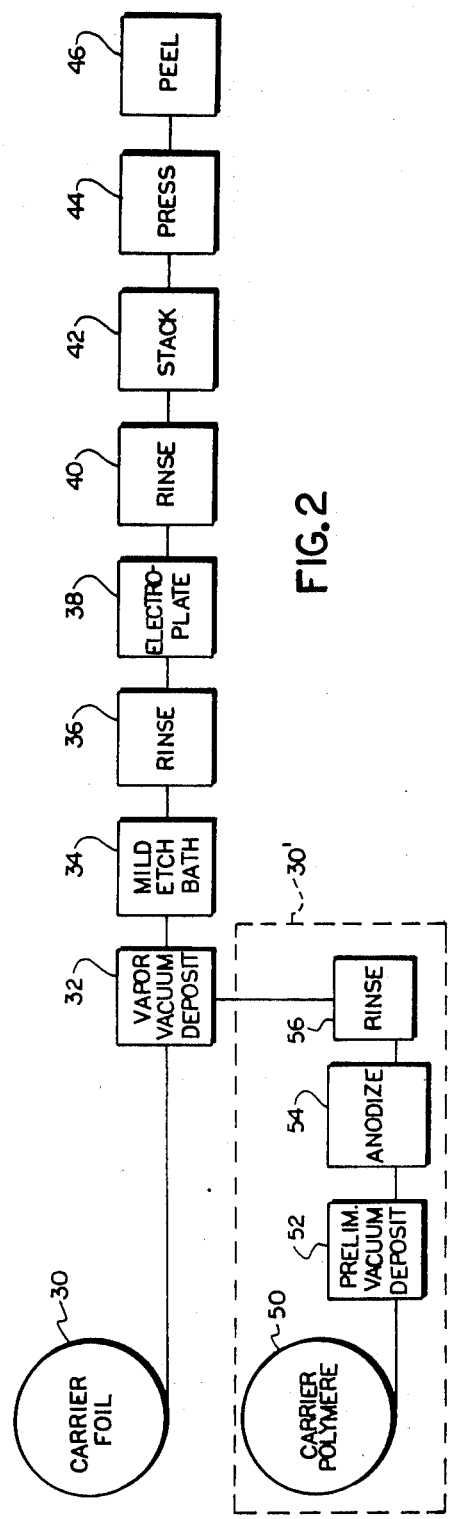

METALLIZED AND PLATED LAMINATES

BACKGROUND OF THE INVENTION

This application is a continuation-in-part of application Ser. No. 516,551, filed July 25, 1983 now abandoned.

The present invention relates to ultra-thin metal foils and processes for their production. The present invention is ideally suited for the production of ultra-thin copper foils for use in printed circuit boards, and will be described with particular reference thereto. It is to be appreciated, however, that the invention is also applicable to the production of ultra-thin foils of various metals and metal alloys including silver, gold, aluminum, magnesium, platinum, zinc, nickel, and the like. It will further be appreciated that such ultra-thin metal films will find utility in a variety of end uses in addition to printed circuit boards, e.g., battery separators.

Heretofore, electric circuit boards have commonly included a plastic or glass reinforced plastic dielectric substrate with a layer of copper foil bonded thereto. To define the circuit pattern, the foil layer was commonly coated with an etch resist layer, such as a photosensitive resist. The photo resist layer was exposed and developed analogous to a photographic negative. This removed the resist layer in areas where the copper foil was to be removed and retained the resist layer in areas where the copper foil was to be retained. The circuit board was exposed to an etching solution which removed the copper material that was unprotected by the remaining resist layer portions. During the etching process, there was a tendancy for the etching fluid to undercut the resist layers. Although removing very thin widths of copper was recognized to be advantageous, the undercutting tended to limit the width of the removed strip to about the same dimension as the thickness of the copper. To manufacture finer, more detailed circuit boards, thinner metal foils were developed.

As the foil was thinned, it eventually reached a thickness at which it was unable to support its own weight without damage. Such foils were generally connoted as ultra-thin foils. Ultra-thin copper foil, for example, is about 12 microns or less. As will be appreciated, the handling of ultra-thin foils during the manufacture of circuit boards was difficult and commonly required supporting carriers for the ultra-thin foil.

Commonly, the carrier was itself a metal foil, such as aluminum, steel, or other conductive materials to facilitate electroplating the ultra-thin foil layer thereon. See for example, U.S. Pat. No. 3,990,926, issued November, 1976 to J. K. Konicek, U.S. Pat. No. 4,169,018, issued September, 1979 to B. L. Berdan, et al., and U.S. Pat. No. 3,998,601, issued December, 1976 to C. B. Yates, et al.

To enable the ultra-thin metal foil layer to be delaminated from the carrier, the carrier was provided with a release layer. In some instances, the metallic foil carrier was electrolytically plated with metals, sulfates, chromates, or oxides to provide an electrically conductive release layer which had relatively poor adhesion properties. The ultra-thin foil was electroplated onto the release layer. After the exposed surface of the ultra-thin layer was treated for better adhesion, the treated surface was laminated under pressure and heat to the substrate. Subsequent to the lamination, the carrier was peeled or otherwise removed from the ultra-thin foil layer.

Electroplating the ultra-thin foil onto the release layer, as described in the above-referenced prior patents, required immersion of the carrier in electroplating baths. This wet production process required substantial support equipment, including heat exchangers, filters, purified water supplies, and metal hydroxide sludge treatment and removal systems.

The present invention provides a new and improved method of producing ultra-thin foils which overcomes the above-referenced problems and others to provide a new and improved ultra-thin foil laminate manufacturing method.

SUMMARY OF THE INVENTION

In accordance with a first aspect of the present invention, there is provided a laminate structure which includes a carrier layer, a vacuum-vapor metallized layer weakly attached to the carrier layer, and an electroplated layer integrally bonded to the vacuum metallized layer.

In accordance with a more limited aspect of the present invention, the carrier layer is a first metal, such as ½ to 3 mil thick aluminum. The vacuum-vapor metallized layer comprises a metal which adheres to the carrier metal with relatively poor adhesion therebetween, e.g., copper and aluminum, or copper and copper. The vacuum vapor deposited layer has a thickness of about 500 nm or less. In one embodiment, the electroplated layer is the same metal as the vacuum-vapor deposited layer. In another embodiment, the electroplated layer is copper and the vacuum-vapor deposited layer is a metal selected for its corrosion resistance, e.g., aluminum or nickel. In either embodiment, the electroplated layer has a thickness of less than 12 microns (12,000 nm).

In accordance with another aspect of the present invention, there is provided a method of laminating which includes the steps of vacuum depositing a first metallic layer on a carrier, and electrolytically depositing a second metallic layer on the vacuum-vapor deposited metal layer.

In accordance with a more limited aspect of the invention, the carrier is a ½ to 3 mil metal foil, e.g., aluminum or copper. The vacuum deposited metal layer is about 10–50 nm thick and the electrolytically deposited layer is less than 12 mils thick.

In accordance with another more limited aspect of the present invention, a preliminary metallic layer is vacuum deposited on a plastic carrier layer.

One advantage of the present invention is that it eliminates porosity and surface contamination attributable to the release layers of the prior art techniques.

Another advantage of the present invention is that it is able to provide a direct metal-on-metal layering with sufficiently poor adhesion therebetween that the layers are able to be delaminated.

Another advantage of the present invention is that it can produce uniform ultra-thin foils with a thickness of 1 micron or less.

Still further advantages of the present invention will become apparent to those of ordinary skill in the art upon reading and understanding the following detailed description of the preferred embodiments.

BRIEF DESCRIPTION OF THE DRAWINGS

The invention may take form in various steps and arrangements of steps or in various structural elements and arrangements of elements. The drawings are only for purposes of illustrating a preferred embodiment of the present invention and are not to be construed as limiting it.

FIG. 1 is a perspective view in partial section of a dielectric circuit board substrate laminated to an ultra-thin metal foil layer with a conductive carrier being peeled away in accordance with the present invention, and wherein the relative thicknesses of the layers are out of scale for simplicity of illustration;

FIG. 2 is a diagrammatic illustration of a process of manufacturing the structure of FIG. 1 in accordance with the present invention; and, FIG. 3 is a perspective view in partial section of an alternate embodiment of a dielectric circuit board substrate laminated to an ultra-thin metal foil layer with a polymeric carrier film being peeled away in accordance with the present invention.

DETAILED DESCRIPTIONS OF THE PREFERRED EMBODIMENTS

With reference to FIG. 1, a disposable carrier 10, in the preferred embodiment, includes a sheet of metal foil such as copper, aluminum, or steel which is ½ to 3 mils in thickness. The carrier is relatively light-weight, has high tensile strength, has dimensional stability, and yet is easily flexed.

An ultra-thin foil layer 12 is adhered directly to the conductive carrier. The ultra-thin foil layer 12 includes a vapor-vacuum layer 14 and a plated metal layer 16. The vapor-vacuum deposited layer is 1–1000 nm, with 10–90 nm being preferred, and adheres to the carrier with a peel strength in the range of 0.2 to 3 pounds per linear inch of width. More particularly, the conductive carrier and the vapor-vacuum deposited layer are selected of metals which adhere together with the 0.2 to 3 pounds peel strength, in a conventional vapor-vacuum depositing operation. One preferred carrier and vapor-vacuum metal pair is aluminum and copper and another preferred pair is copper and copper. However, aluminum, chrome, magnesium, zinc, nickel, gold, silver, and other vacuum depositable metals are also contemplated, provided each is used with a carrier to which it adheres with the appropriate peel strength.

Metals which are relatively corrosion or stain resistant, such as aluminum, chrome, zinc, and nickel, are particularly advantageous in the manufacture of circuit boards. After the carrier is peeled away, the vapor-vacuum deposited layer remains exposed until the circuit board has a pattern etched therein. Corrosion and stain resistant vacuum deposited layers protect the surface of the circuit board against corrosion and staining, extending its shelf life and facilitating its handling. Further, the vapor-vacuum deposited layer is sufficiently thin that it can be readily removed during the conventional cleaning steps undertaken as the circuit board is prepared to receive the pattern.

The plated layer 16, in the preferred embodiment, is an electrolytically plated layer of copper which is about 1 to 12 microns thick. However, other plating techniques are also contemplated, such as electroless plating and other wet bath plating techniques, as well as dry techniques. Other metals with good electrical conductivity, such as silver, gold, and aluminum, are also advantageous for circuit boards.

The carrier with attached ultra-thin metal foil is a staple article of commerce which is sold to circuit board manufacturers and other industries which utilize ultra-thin foils. In the construction of circuit boards, the ultra-thin metal layer 12 is temperature and pressure laminated to a dielectric substrate 18, such as a 1/32nd, 1/16th ⅛th, or ¼th-inch sheet of glass reinforced epoxy or phenolic resin, or a sheet of polyamide, polysulfone, or styrene, which may or may not be reinforced.

With reference to FIG. 2, the laminate structure of FIG. 1 is constructed in a multi-step process. A source 30 of the conductive carrier 10 supplies the carrier to a vapor-vacuum depositing means 32 which deposits a thin layer of the vapor-vacuum deposited metal on the carrier. Vapor-vacuum deposited layers of 1–1000 nm in thickness are contemplated with 10–90 nm being preferred. The carrier with the vacuum deposited layer is conveyed through a mild etching bath 34 and a rinse tank 36 to condition the surface for plating. The rinsed, etched vapor-vacuum deposited metal layer/carrier laminate is conveyed to an electrolytic plating means 38 which electrolytically plates the electrolytically plated layer 16 onto the vapor-vacuum deposited layer 14. In the preferred embodiment, the electrolytic plating means includes a conventional copper plating bath which includes copper complexed with cyanide, sulfates, nitrates, or the like. Optionally, a first bath may plate a part of the electrolytically plated layer 16 and a second or additional bath or baths may plate the remainder.

The carrier/ultra-thin foil laminate is rinsed in a rinse bath 40 in preparation for lamination with the dielectric substrate 18. The ultra-thin foil face is stacked against a dielectric sheet either manually or by a stacking means 42. A press 44 heats and presses the carrier, ultra-thin foil, and dielectric substrate together under an appropriate pressure and temperature to bond foil to the substrate. After the ultra-thin foil is bonded to the dielectric substrate, the conductive carrier 10 is peeled from the laminate either manually or by a peeling means 46.

By way of a first specific example, the carrier 10 is rolled, annealed copper. The vapor-vacuum depositing means 32 sputters 40 nm of copper which is 99.99% pure onto the carrier. The mild etching bath 34 is a 3% sulfuric acid aqueous solution and the bath time is about one minute. The rinse baths 36 and 40 are deionized water. The electrolytic plating means 38 includes a conventional electrolytic plating bath and an acid bath which includes 200 g/l of hydrated copper sulfate, 55 g/l of copper metal, 50 g/l of sulfuric acid (concentrated), about 500 parts per million sodium chloride, and has a bath temperature of about 30° C. A current density of 30 amps per square foot has been found satisfactory to increase the foil layer 12 to about 10 microns or 10,000 nm after about twleve minutes. The ultra-thin foil/carrier laminate and a 1/16th inch glass-filed bis-phenol-A and tetrabromobis-phenol-A epoxies dielectric substrate is pressed together at 350° F. and 90 psi for about twenty-five minutes. The copper metal carrier is peeled off the ultra-thin foil layer 12 with a force of about 1 pounds per linear inch.

As a second example, the conductive carrier is an aluminum foil about 1 mil thick. Copper is both vapor-vacuum deposited and electrolytically deposited thereon using the processes of the first example.

FIG. 3 illustrates an alternate carrier/ultra-thin foil/-dielectric substrate in which like elements with FIG. 1 have been marked with the same reference numeral but followed by a prime ('). An electrically conductive carrier 10' includes a polymeric layer 20 and an electrically conductive release layer 22. The electrically conductive release layer is preferably a metallic compound, such as a metal, metal oxide, metal sulfate, or metal chromate which is less than about 600 nm thick. An ultra-thin foil layer 12′ includes a vapor-vacuum deposited layer 14′ and an electrolytically plated layer 16′. In the preferred embodiment, the ultra-thin foil layer 12′ is copper and is not more than 12 microns in thickness, with the vapor-vacuum deposited layer being 10-90 nm of the total thickness. A dielectric substrate 18′, such as ⅛ inch glass-reinforced epoxy resin, is bonded to the ultra-thin metal layer 12′ under heat and pressure. Thereafter, the carrier 10′ is peeled away leaving the ultra-thin foil layer 12′ adhered to the dielectric substrate with the vapor-vacuum deposited layer 14′ providing the exposed surface.

With reference to FIG. 2, the alternate laminate of FIG. 3 is manufactured much like the laminate of FIG. 1 but with a series of preliminary steps to produce the electrically conductive carrier 10′ for the vapor-vacuum metallizing means or step 32. A source 50 of the polymeric film 20 provides the film to a preliminary vapor-vacuum depositing means 52 which deposits a 1-1000 nm metal layer. Preferably the preliminary metal layer is a 10-500 nm layer of aluminum, copper, magnesium, zinc, or the like. The vapor-vacuum-coated polymer may be supplied directly to the vapor-vacuum depositing means 32 or may be oxidized by exposure to the atmosphere, immersion in an oxidizing bath 54, such as a steam bath, or the like. The oxidation step provides the vapor-vacuum deposited layer with at least a surface layer of metal oxide, sulfate, chromate, or the like. The electrically conductive carrier 10′ consisting of a polymeric film and an oxide layer is rinsed in a bath 56 and supplied to a vapor-vacuum depositing means 32 and the method above-described in conjunction with FIG. 2 repeated therewith.

By way of specific example, a polyethylene terephthalate polymeric film is vacuum-vapor deposited with about 500 nm of aluminum. The aluminum is oxidized with a 15 psi steam bath for two minutes. The electrically conductive carrier, which includes polymeric and metal oxide layers, is rinsed in deionized water and supplied to vapor-vacuum depositing means 32 of FIG. 2 which deposits a 40-90 nm layer of copper. Thereafter the same steps as described in the first example are repeated.

In yet another embodiment of the present invention, the carrier is a ½ to 3 mil polymer, preferably polyethylene terephthalate. A metal layer about 10-500 nm thick is vapor-vacuum deposited on the polymeric carrier. Although copper is a preferred vapor deposited metal, aluminum, zinc, nickel, gold, silver, chrome, magnesium, and other metals which adhere to the polymeric carrier with a peel strength of about 0.2 to 3 pounds per linear inch, are also contemplated. Another metal layer about 1 to 12 microns thick is electroplated to the vapor-vacuum deposited layer. Although copper is a preferred electroplated metal, other metals with good electrical conductivity are also contemplated.

The invention has been desribed with reference to the preferred embodiments. Obviously, modifications and alterations will occur to others upon reading and understanding the preceding detailed description of the preferred embodiments. It is intended that the application be construed as including all such alterations and modifications insofar as they come within the scope of the appended claims, or the equivalents thereof.

Having thus described the preferred embodiments, the invention is now claimed to be:

1. A method of laminating comprising:
vapor-vacuum depositing a vapor-vacuum deposited, first metallic layer on a carrier which includes a polymeric film such that the first metallic layer adheres to the carrier with a peel strength of 0.2 to 3 pounds per linear inch of width and is about 10-500 nm thick; and,
electrolytically depositing an electrolytically deposited, second metallic layer which is less than 12 microns thick on the vacuum vapor deposited metallic layer.

2. The method as set forth in claim 1 further including the step of laminating the electrolytically deposited metal layer to a dielectric substrate.

3. The method as set forth in claim 2 further including the step of peeling the carrier from the vapor-vacuum deposited metal layer such that the dielectric substrate, the vapor-vacuum deposited layer, and the electrolytically deposited metal layer remain laminated together.

4. The method as set forth in claim 3 wherein the electrolytically deposited metal layer is copper and the vapor-vacuum deposited metal layer is selected of the group consisting essentially of copper, aluminum, chrome, magnesium, zinc, nickel, silver, and gold.

5. The method as set forth in claim 1 wherein the vapor-vacuum deposited, first metallic layer is selected of the group consisting of copper, aluminum, chrome, magnesium, zinc, nickel, silver, and gold.

6. A method of laminating comprising the steps of:
vapor-vacuum depositing an oxidizable metal on a polymeric layer;
anodizing the oxidizable metal layer to form an oxide, sulfate, or chromate at least on the surface thereof, such that the polymeric layer and anodized metal layer together comprise an electrically conductive carrier;
vapor-vacuum depositing a vapor-vacuum deposited first metallic layer on the anodized metal layer; and,
electrolytically depositing an electrolytically deposited, second metallic layer on the vacuum-vapor deposited metallic layer.

7. The method as set forth in claim 6 wherein the oxidizable vapor-vacuum deposited metal layer is less than about 500 nm thick.

8. The method as set forth in claim 7 wherein the oxidizable metal is selected from the group consisting essentially of copper, aluminum, magnesium, and tin.

9. The method as set forth in claim 8 wherein the vapor-vacuum deposited, first metal layer is selected from the group consisting essentially of copper, aluminum, chrome, magnesium, zinc, nickel, silver, and gold.

10. The method as set forth in claim 8 wherein the vapor-vacuum deposited first metallic layer is selected from the group consisting essentially of aluminum, chrome, zinc, and nickel, and wherein the electrolytically deposited second metal layer is selected from the group consisting essentially of copper and aluminum, whereby upon removal of the carrier, the vapor-vacuum deposited first metal layer inhibits corrosion and staining of the electrolytically deposited metal layer.

11. The method as set forth in claim 6 wherein the vapor-vacuum deposited first metallic layer adheres to the carrier with a peel strength of about 0.2 to 3 pounds per linear inch of width and is about 10-500 nm thick and the electrolytically deposited second metal layer is less than 12 microns thick.

12. The method as set forth in claim 6 wherein the carrier and the vapor-vacuum deposited first metallic layer adhere together after the vapor-vacuum depositing step with less than about 3 pounds per linear inch of width.

13. The method as set forth in claim 6 wherein the vapor-vacuum deposited layer is 10–90 nm thick and the electrolytically deposited layer is about 1–12 microns thick.

14. The method as set forth in claim 1 wherein the vapor-vacuum deposited, first metallic layer is selected from the group consisting of aluminum, chrome, zinc, nickel, and gold, and wherein the electrolytically deposited metal layer is selected from the group consisting essentially of copper, aluminum, and silver, whereby upon removal of the carrier, the vapor-vacuum deposited metallic layer inhibits staining and corrosion of the electrolytically deposited metal layer.

* * * * *